United States Patent [19]

Stokes et al.

[11] Patent Number: 5,278,557
[45] Date of Patent: Jan. 11, 1994

[54] CURSOR MOVEMENT CONTROL KEY AND ELECTRONIC COMPUTER KEYBOARD FOR COMPUTERS HAVING A VIDEO DISPLAY

[75] Inventors: Ronald G. Stokes; Theodore D. Clark, both of Spokane, Wash.

[73] Assignee: Key Tronic Corporation, Spokane, Wash.

[21] Appl. No.: 658,793

[22] Filed: Feb. 19, 1991

[51] Int. Cl.$^5$ .................................. H03M 11/00
[52] U.S. Cl. .................................. 341/34; 338/128; 74/471 XY; 200/520
[58] Field of Search .......... 341/34, 22; 340/709, 340/711, 706, 710; 74/471; 338/87, 89, 90, 114, 69, 128; 84/DIG.7, 745, 720, 670, 644, 658, 690; 200/512, 517, 527, 322, 336, DIG.2; 273/148

[56] References Cited

U.S. PATENT DOCUMENTS

| | | | |
|---|---|---|---|
| 4,124,787 | 11/1978 | Aamoth et al. | 74/471 XY |
| 4,268,815 | 5/1981 | Eventoff et al. | 338/69 |
| 4,276,538 | 6/1981 | Eventoff et al. | 338/69 |
| 4,301,337 | 11/1981 | Eventoff | 200/5 A |
| 4,314,227 | 2/1982 | Eventoff | 338/99 |
| 4,314,228 | 2/1982 | Eventoff | 338/114 |
| 4,315,238 | 2/1982 | Eventoff | 338/99 |
| 4,439,648 | 3/1984 | Reiner et al. | 273/148 B |
| 4,451,714 | 5/1984 | Eventoff | 200/5 A |
| 4,489,302 | 12/1984 | Eventoff | 338/99 |
| 4,680,577 | 7/1987 | Straayer et al. | 340/711 |
| 4,739,299 | 4/1988 | Eventoff et al. | 338/99 |
| 4,810,992 | 3/1989 | Eventoff | 338/99 |
| 4,963,702 | 10/1990 | Yaniger et al. | 178/18 |

*Primary Examiner*—John K. Peng
*Assistant Examiner*—Robert Gray
*Attorney, Agent, or Firm*—Wells, St. John, Roberts, Gregory & Matkin

[57] ABSTRACT

A cursor movement control key and electronic keyboard for a computer having a video display incorporates a force-sensitive resistor having a junction resistance which varies inversely with pressure applied thereto. The external key cap engages an actuator which bears against the force-sensitive resistor. The actuator has a plurality of four pads which bear against respective electrode regions of the force-sensitive resistor. The pads are positioned at the 0°, 90°, 180°, and 270° positions. The actuator mounts relative to a keyboard mounting plate. At least one of the actuator and mounting plate include opposed lateral projections which engage relative to the other of the actuator and mounting plate to both, a) retain the actuator to the mounting plate, and yet b) allow clearance for tilting movement of the actuator relative to the mounting plate. The force-sensitive resistor is comprised of a material which is predictably and consistently responsive to operator proportional force inputs between about 50 grams and 175 grams. The opposing electrode regions are connected with parallel resistances which cause the resulting resistance response to be more linear for operator force inputs below some preset value selected somewhere between about 50 and 175 grams.

28 Claims, 11 Drawing Sheets

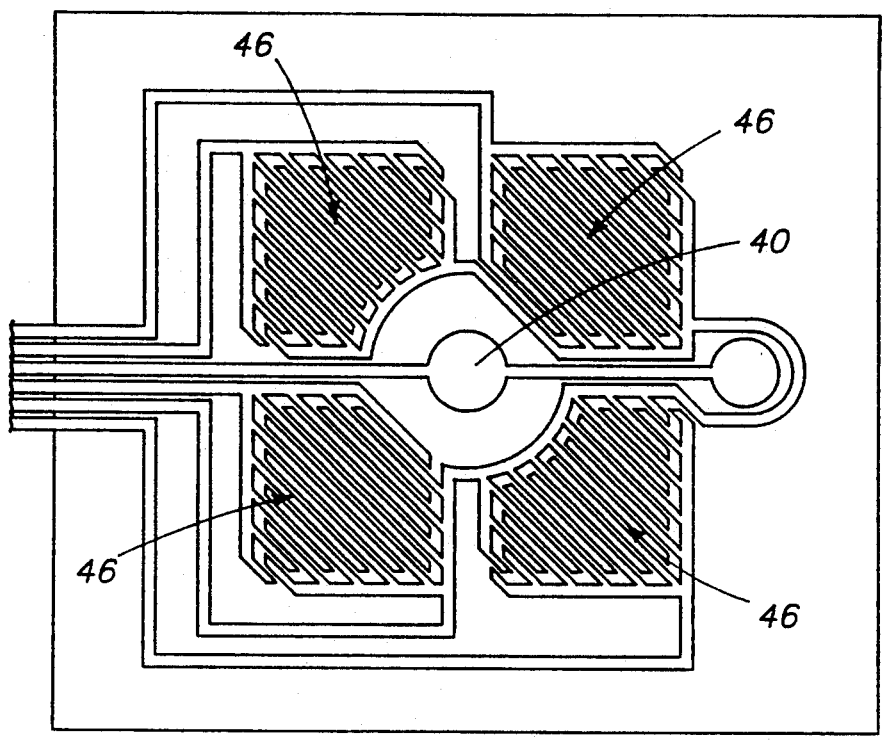
_Fig 3 PRIOR ART_
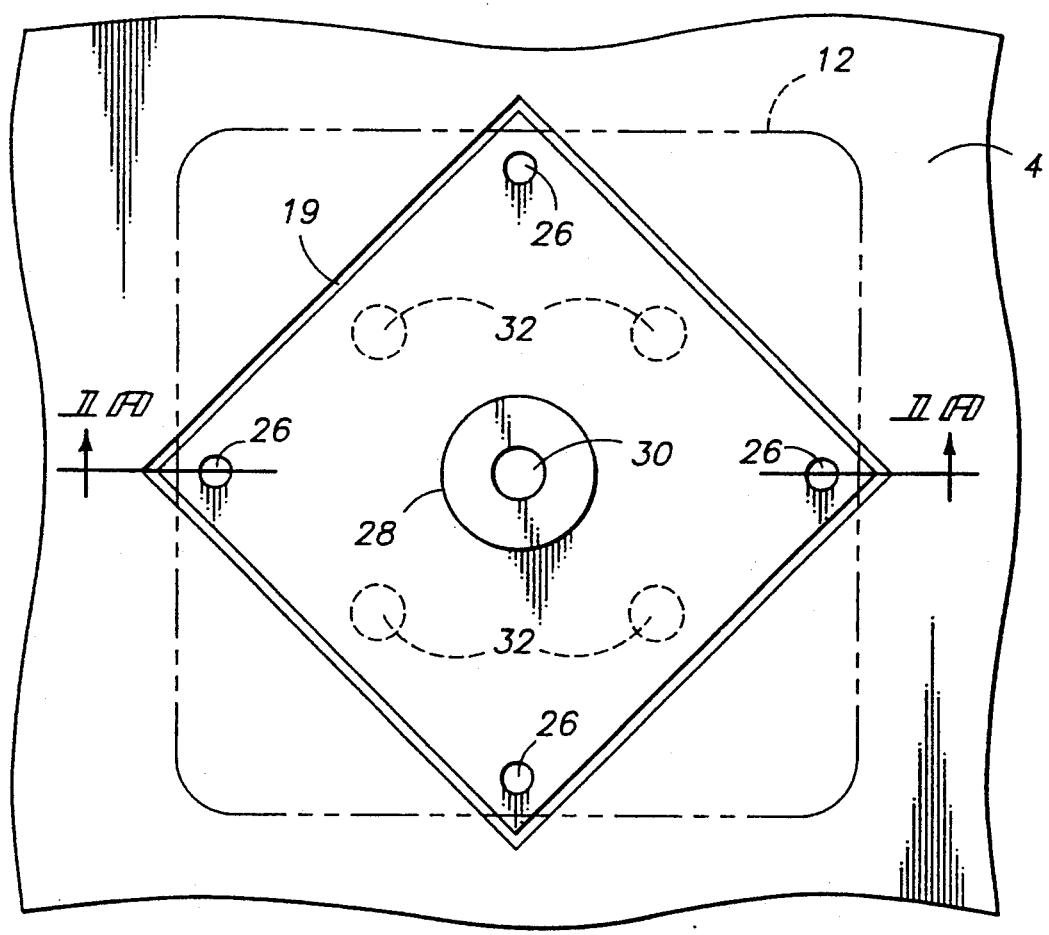
_Fig 4 PRIOR ART_

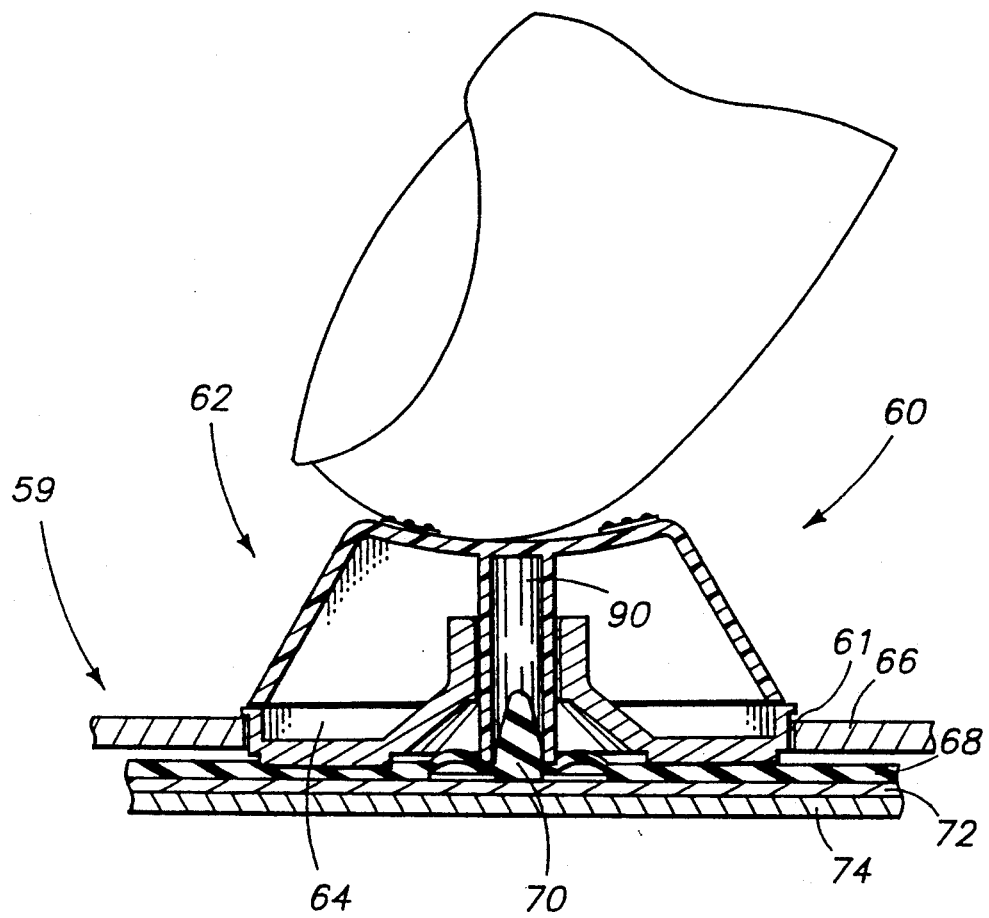

CURSOR MOVEMENT CONTROL KEY AND ELECTRONIC COMPUTER KEYBOARD FOR COMPUTERS HAVING A VIDEO DISPLAY

TECHNICAL FIELD

This invention relates generally to cursor movement control keys for computers having a video display, and to electronic computer keyboards incorporating such cursor movement control keys. More particularly, this invention relates to such cursor movement control keys and electronic computer keyboards incorporating a force-sensitive resistor having opposed conductors with a junction resistance which varies inversely with pressure applied thereto.

BACKGROUND OF THE INVENTION

A computer operator typically inputs data through a keyboard and views the output via a video display screen. The location at which the information is entered relative to the screen is determined by the position of a cursor or cross-hair marker. The operator must be provided with a means of moving the cursor or other marker about the screen to enable data input at desired locations. As cursor positioning may be required at any location on the screen, means must be provided for both vertical and horizontal movement of the cursor. Accordingly, essentially every keyboard is provided with four cursor movement control keys which move the cursor straight up, straight down, straight left or straight right. Diagonal or other angled movements are generated by successive pushing of two of the cursor movement control keys.

With the advent of computer graphics and graphical user interfaces, pointing devices have been designed which enable the user to move a cursor quickly, easily and directly to any desired location on a screen. These devices include data tablets, mice, trackballs and joy sticks. Such devices are typically incorporated in a housing separate from the computer keyboard. Such consumes desk space, and is typically unsuited for portable computers such as the increasingly popular laptop and notebook size computers. Trackballs have been incorporated into keyboards, but they typically consume a large amount of space.

It would be desirable to incorporate cursor/crosshair movement control of any direction into a single key positioned within the confines of a conventional computer keyboard housing. Preferably, the size of such a key would be no greater than the existing size of any alphanumeric key on a keyboard. One such key is shown by way of example in U.S. Pat. No. 4,680,577. Sliding movements of such control key impart cursor movement on the screen.

Another more recent type of cursor movement control key employs force-sensitive resistors for registering operator key inputs. A force-sensitive resistor is typically comprised of two polymer sheets laminated or otherwise spaced closely relative to one another. One sheet is coated with spaced conductive interdigiting electrodes. The other sheet is coated with a polymer film which exhibits decreasing resistance with increasing force applied normal to the film surface. When force is applied to the opposing sheets, the conductive polymer material shunts the interdigiting electrodes to a greater or lesser degree depending upon the applied force. Thus, greater force results in greater current flow between the interdigiting electrodes.

Force-sensitive resistors were first developed for use in musical instruments such as electric drums and pianos, and as well have found use in electronic computer keyboard switches. Example construction and operation of force-sensitive resistors are explained in U.S. Pat. Nos. 4,268,815; 4,276,538; 4,301,337; 4,314,227; 4,314,228; 4,315,238; 4,451,714; 4,489,302; 4,739,299; 4,810,992; and 4,963,702, which are hereby incorporated by reference. Such force-sensitive resistors exhibiting a desired force-resistance relationship can be purchased through Interlink Electronics of Santa Barbara, Calif. and Carpenteria, Calif.

One prior art cursor movement control key for a computer having a video display, and which employs a force-sensitive resistor, is illustrated in FIG. 1A in partial section and designated with reference numeral 10. FIG. 1A is a partial diagrammatic section of a keyboard which supports an external key cap or body 12 for depression and tilting movement. Electronic computer keyboards include what is commonly referred to as a top mounting plate 14 and a bottom or backing plate 16. An actuator/housing 18 is suspended as shown within an opening 19 of mounting plate 14, and supports external key 12 for depression relative thereto. A rubber dome sheet 20 and switching membrane 22 are provided between actuator 18 and backing plate 16. Components or sheets 14, 20, 22, and 16 are typically each of a unitary construction extending throughout the keyboard key area.

Rubber dome sheet 20 functions as a biasing means for biasing the keys to their normal, extended positions using resiliently collapsible domes 15. Switching membrane 22 incorporates opposed conductive elements which function as on-off switches depending upon the relative position of external key 12. Switching membrane 22 also incorporates the above-described force-sensitive resistor material, as will be more fully described below. External cap 12 would be retained relative to actuator 18 by means of conventional spring clips (not shown) which also enable depression of cap 12 relative to actuator 18. Actuator 18 is retained relative to the keyboard by means of screws 24, screw plate 26, and adjustable spring 29, as will be more fully described below. FIG. 1A illustrates key 10 in its fully extended position, while FIG. 2A illustrates key 10 in a depressed condition. FIGS. 1B and 2B are enlarged sectional views of switching membrane 22 in its extended and depressed conditions, respectively.

More particularly and with reference to FIGS. 1A, 1B, 2A, 2B, 3 and 4, actuator 18 is of a rotated square-diamond shape, which is complementary to the size and shape of opening 19 in mounting plate 14. Actuator 18 includes three threaded holes 26 at its periphery which receive mounting and tension screws 24, for reasons which will be more fully described below. A raised portion 28 is provided in the center of actuator 18, and includes an opening or hole 30 extending therethrough. External key 12 includes a transverse stem 13 (FIGS. 1A, 2A) which is slidably received within opening 30. Key 12 and actuator 18 are constructed such that limited movement of key 12 is possible relative to actuator 18. Specifically, the length of stem 13 is sufficient such that depression of key 12 will cause collapsing of dome 15 of rubber dome sheet 20 and, at such point, cause engagement of a portion 17 of external key 12 with actuator raised portion 28. At this point, continued depression of key 12 transfers force and correspondingly limited movement directly to actuator 18 by such engagement.

Actuator 18 includes four actuator nodules 32 positioned diagonally relative to raised portion 28 from the underside of actuator 18 (FIG. 4). Actuator nodules 32 are so positioned for engagement with isolated conductive electrode regions of a force-sensitive resistor, which will become more apparent from the continuing discussion. Depression of external key 12 engages cap stem 13 and actuator nodules 32 through dome sheet 20 against switching membrane 22.

Referring more particularly to FIGS. 1B, 2B and 3, switching membrane 22 is comprised of a top layer 34, a spacer layer 36, and a bottom layer 38. A pair of opposed conductive switch contacts 40, 42 are provided on the underside of top layer 34 and top side of bottom layer 38, respectively. Contacts 40, 42 are positioned beneath dome 15 of dome sheet 20 and are depressible against one another through an opening 44 provided for such purpose in spacer middle layer 36.

A series of four isolated and conductive interdigiting electrodes 46 is formed on the underside of top layer 34. Each electrode region is positioned diagonally at the 45°, 135°, 225° and 325° positions relative to opposed contacts 40, 42, and collectively they form an outer shape of a square. Electrode regions 46 and actuator nodules 32 are positioned relative to one another such that respective nodules 32 engage in the respective centers of isolated electrode regions 46. A force-sensitive resistive polymer 48 is continuously provided about the top of middle layer 36 to correspond in positioning to electrode regions 46.

As evident from FIGS. 1A, 1B and 2A, 2B, depression of key 12 closes switch contacts 40 and 42, transfers pressing force against actuator 18, and correspondingly force to force-sensitive resistor regions 46 and 48 through actuator nodules 32. Actuator 18 is supported for limited angular tilting movement within mounting plate opening 19 for loading and unloading of various of the four conductive grid regions based upon where and how the operator depresses and angles key 12. The circuitry and software interprets the relative loadings of the various force-sensitive resistor electrode regions to impart cursor movement. Additionally, the quantity of force applied by the user affects conductivity through the respective force-sensitive resistor grid regions, with such information being used to impact the speed of cursor movement. The harder the depression applied by the operator, the faster the cursor movement.

The force versus resistance characteristics of the force-sensitive resistor of FIGS. 1-4 is illustrated graphically in FIG. 5. As evident, resistance drops as the amount of applied force increases. Also, force inputs at less than 200 grams fall on a significantly steep area of the curve. Accordingly, very minor changes in force in this area produce drastically different current flows, resulting in erratic or unpredictable operation. Equally important, a 200 gram pressure input by a user's finger is excessive and would not provide the desired and necessary tactile feel over the key for precise operator control of cursor movement. With the cursor movement control key FIGS. 1-4, such drawbacks or limitations are partially overcome by preloading the force-sensitive resistor to enable operator inputs significantly less than 200 grams and which enable more predictable operation for proportional operator force inputs.

Such preloading is achieved by or through the illustrated screws 24, screw plate 26, and tension spring 29 (FIGS. 1A and 1B). Screws 24 are slidably received through respective openings in screw plate 26 and thread into openings 27 on actuator 18. Spring 29 is sandwiched between screw plate 26 and the underside of backing plate 16. At manufacture and test, screws 24 are threaded sufficiently to draw actuator 18 against membrane 22 to provide a desired and equal preloading effect against each of electrode regions 46 such that reliable operation will be obtained with lighter operator force inputs. Such a construction is not however without drawbacks. For example, the requirement for adjustment increases problems and the time required at manufacture. Further, the construction could fall out of adjustment in operation, requiring the end user to attempt to readjust the required preload or effectively shorten the life of the key.

An additional drawback associated with the above-described construction relates to the diagonal positioning of electrode regions 46 relative to the orientation of the key. Such orientation in operation can provide less than desirable reliability when moving a key in the precise 0°, 90°, 180° or 270° positions, which are the predominant directions which operators move the cursor.

It would be desirable to overcome these and other drawbacks associated with cursor movement control keys for a computer having a video display which incorporate force-sensitive resistors.

BRIEF DESCRIPTION OF THE DRAWINGS

One or more preferred embodiments of the invention are illustrated in the accompanying drawings, which are briefly described below.

FIG. 3 is an enlarged diagrammatic depiction of the underside of a top layer of a switching membrane component of the FIG. 1B prior art cursor movement control key.

FIG. 4 is a top partial view, with the key cap removed, of FIG. 1A.

FIG. 14 corresponds to FIG. 6, and illustrates the cursor movement control key in accordance with the invention in a depressed and slightly tilted position.

DETAILED DESCRIPTION OF THE PREFERRED EMBODIMENTS

Figure 1A:
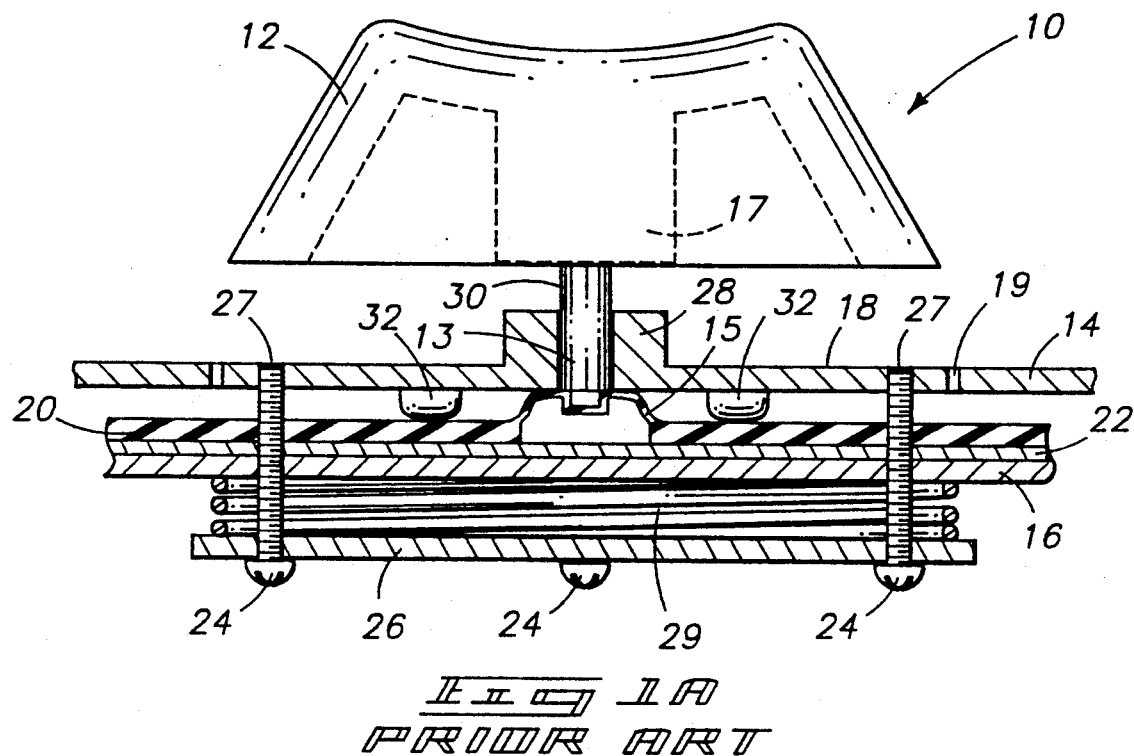
FIG. 1A is a diagrammatic fragmentary/section view of a prior art cursor movement control key, is referred to extensively in the "Background Section" above, and corresponds in position to line 1A—1A in FIG. 4.
Figure 1B:
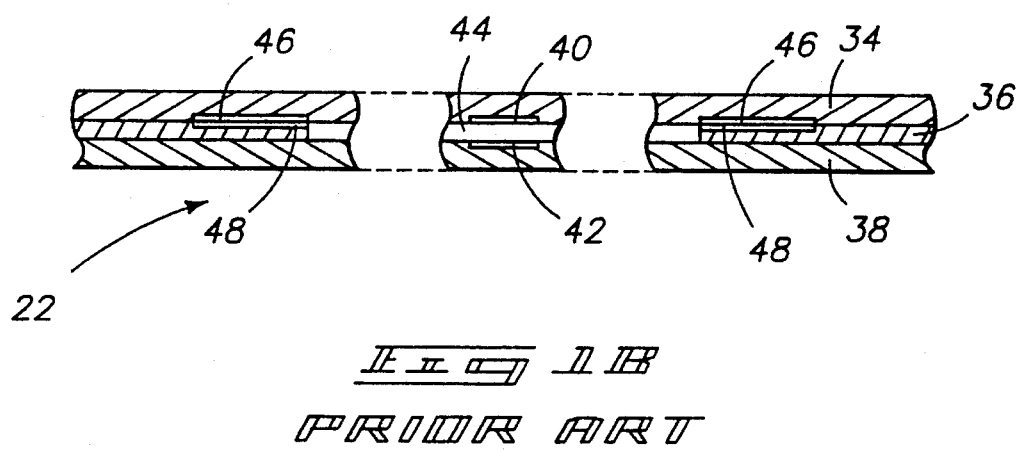
FIG. 1B is a enlarged diagrammatic partial fragmentary/section view of a membrane component of the cursor movement control key of FIG. 1A, illustrating the relative lateral positioning of conductive components of a switching membrane.
Figure 2A:
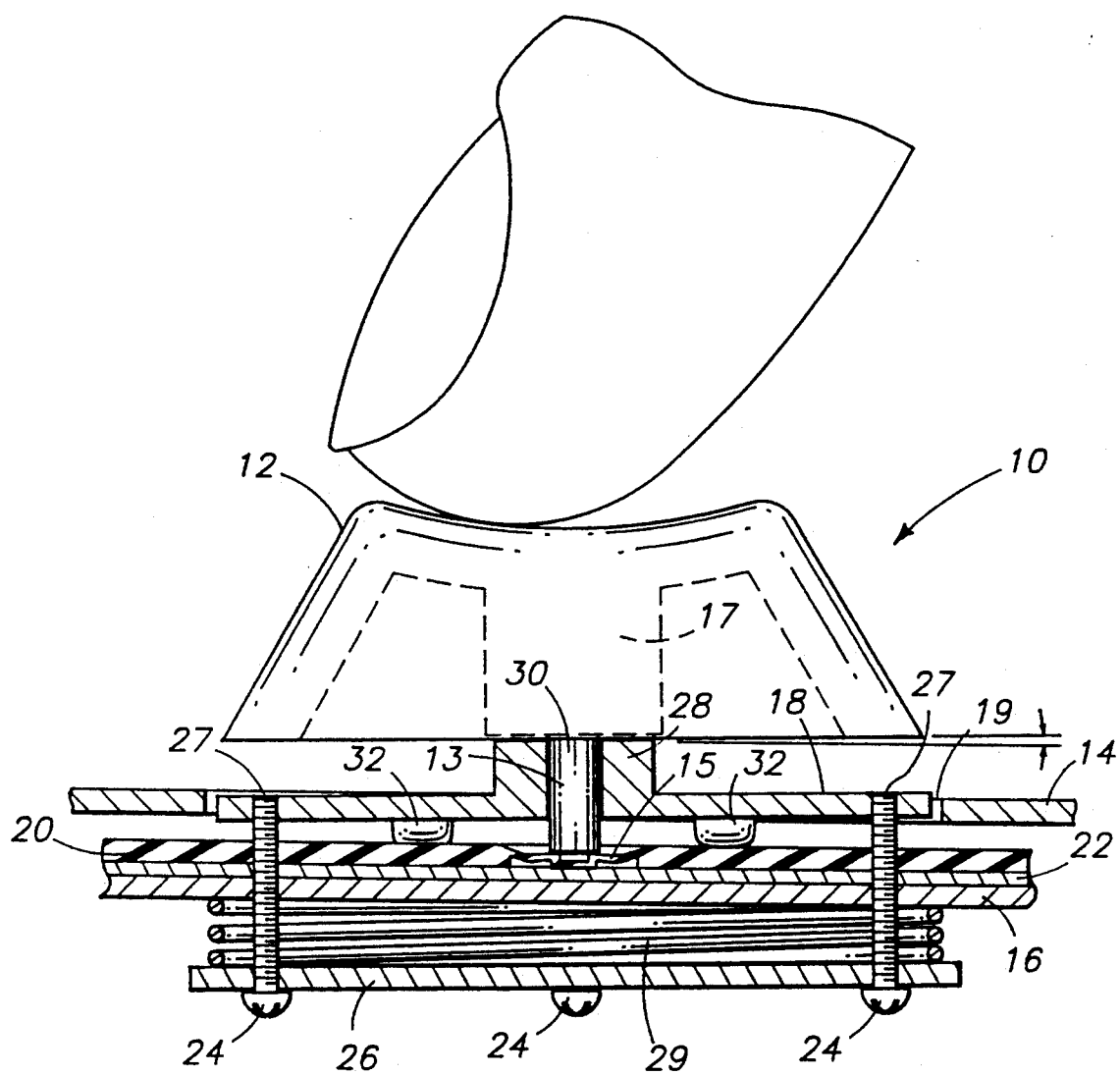
FIGS. 2A and 2B correspond respectively to FIGS. 1A and 1B, with FIGS. 2A and 2B illustrating the prior art key in a depressed and tilted condition.
Figure 2B:
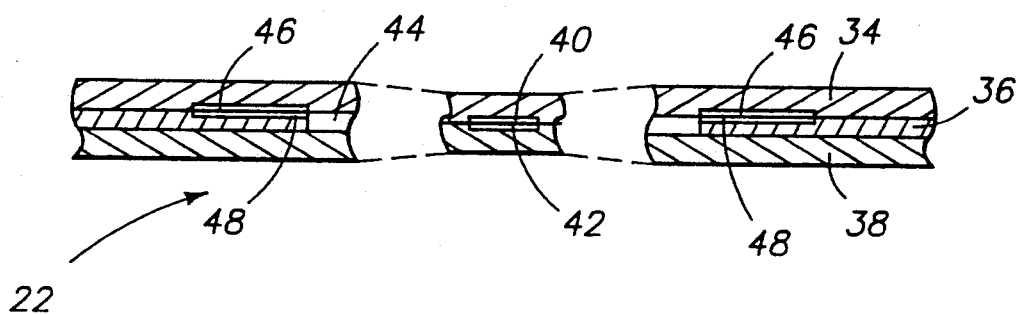
Figure 5:
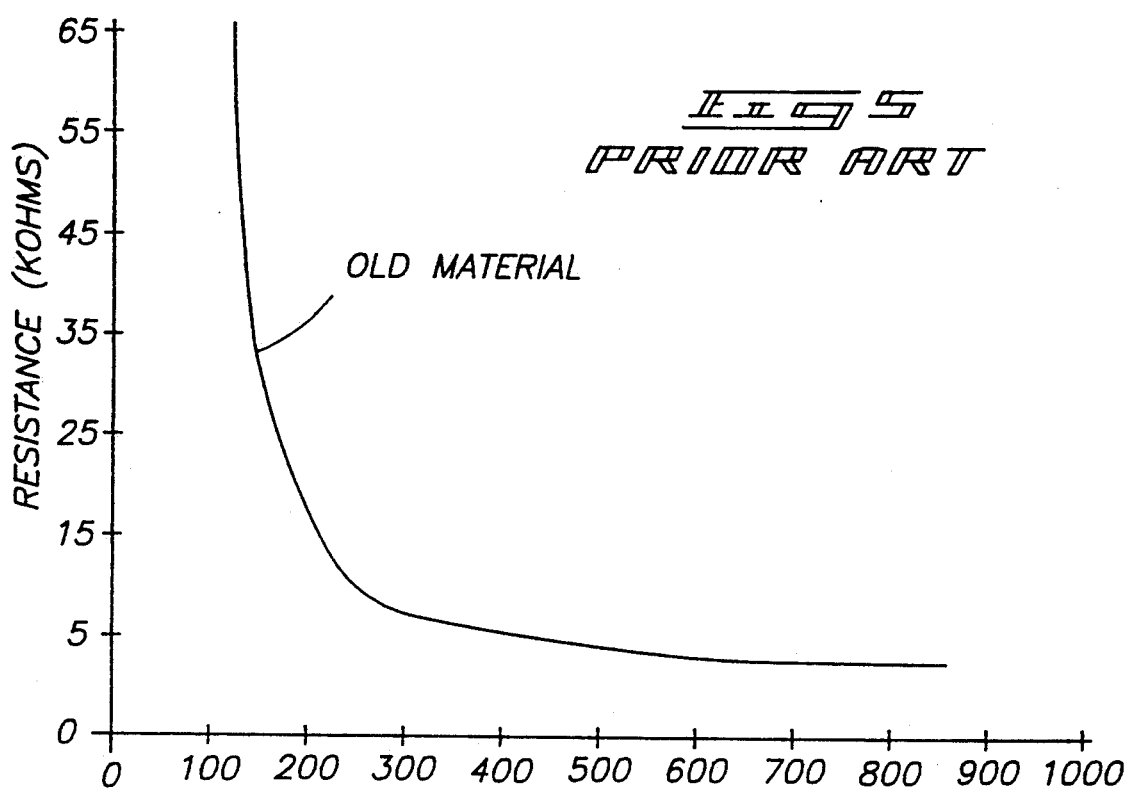
FIG. 5 is a graph of force versus resistance for a force-sensitive resistor material incorporated in the cursor movement control key of FIG. 1A.

This disclosure of the invention is submitted in furtherance of the constitutional purposes of the U.S. Patent Laws "to promote the progress of science and useful arts" (Article 1, Section 8).

In accordance with one aspect of the invention, a cursor movement control key for a computer having a video display comprises:

an external body sized for engagement by an operator's finger;

support means supporting the external body for angular tilting movement about 360°;

a force-sensitive resistor comprised of opposed conductors having a junction resistance which varies inversely with pressure applied thereto, the opposed conductors not being subjected to a resting preloaded compression against one another, at least one of the conductors being comprised of a force-sensitive conductive material which is predictably and consistently responsive to operator proportional force inputs between about 50 grams and 175 grams, the opposed conductors collectively comprising a plurality of isolated conductive electrode regions, the isolated conductive electrode regions being connected with parallel resistances, in an associated circuit board, which cause the resistance response to pressure to be more linear to avoid unpredictable or erratic cursor movement which would be annoying to the user based upon very light force inputs; and an actuator operably engageable against the opposed conductors upon depression and angular tilting of the external body, the actuator having a plurality of engagement pads positioned to selectively engage the plurality of isolated conductive electrode regions upon depression and selective angular tilting of the external body.

In accordance with another aspect of the invention, a cursor movement control key for a computer having a video display comprises:

an external body sized for engagement by an operator's finger;

support means supporting the external body for angular tilting movement about 360°;

a force-sensitive resistor comprised of opposed conductors having a junction resistance which varies inversely with pressure applied thereto, the force-sensitive resistor comprising an array of four isolated conductive electrode regions equally spaced about 360°, each of the conductive electrode regions being centrally and symmetrically formed about one of the 0°, 90°, 180°, and 270° positions; and an actuator operably engageable against the opposed conductors upon depression and angular tilting of the external body, the actuator having at least four engagement pads, the four engagement pads being equally spaced about 360° and symmetrically positioned to selectively engage one each of the 0°, 90°, 180°, and 270° conductive electrode regions upon depression and selective angular tilting of the external body.

An electronic computer keyboard in accordance with the invention would incorporate a cursor movement control key as described alternatively above.

In accordance with yet another aspect of the invention, an electronic computer keyboard for a computer having a video display comprises:

a plurality of keys;

a mounting plate operably supporting the keys for depression, the mounting plate having opposing faces, a defined thickness and a plurality of openings extending therethrough between the opposing faces, the openings depressibly receiving the keys;

a backing plate against which the keys are operably depressible;

biasing means for biasing the keys to an extended position;

at least one of the plurality of keys comprising a cursor movement control key, the cursor movement control key comprising:

an external body sized for engagement by an operator's finger and having a transverse stem;

a force-sensitive resistor comprised of opposed conductors having a junction resistance which varies inversely with pressure applied thereto, the opposed conductors collectively comprising a plurality of isolated conductive electrode regions, the force-sensitive resistor being positioned relative to the backing plate for bearing engagement against the backing plate upon depression of the external body;

an actuator positioned between the external body and backing plate, the actuator supporting the external body for limited depression relative thereto and supporting the external body for selective tilting movement about 360° relative to the mounting plate, the actuator including opposing faces and peripheral edges and having a shape and size complementary for receipt in one of the mounting plate openings, the actuator being so received in one of the mounting plate openings;

at least one of the actuator and mounting plate including opposed lateral projections which engage relative to the other of the actuator and mounting plate to both, a) retain the actuator to the mounting plate, and yet b)

allow clearance for tilting movement of the actuator relative to the mounting plate;

portions of the actuator and external body being engageable relative to one another to cause the external body to bear against the actuator for tilting movement thereof and bearing engagement relative to the force-sensitive resistor and backing plate upon depression of the external body by an operator;

one of the actuator opposed faces having a plurality of engagement pads positioned to selectively engage the plurality of isolated conductive electrode regions upon selective engagement of the external body and actuator; and the electronic keyboard including integrated circuitry in electrical communication with the force-sensitive resistor for interpreting depression and tilting of the external body to selectively effect cursor movement.

More particularly and with reference to FIGS. 6–14, a preferred embodiment cursor movement control key is indicated generally by reference numeral 60. Key 60 comprises an external body or key cap 62 sized for engagement by an operator's finger. External body 62 is supported by an actuator 64. Actuator 64 is received in a complementary fashion within an opening 61 of a keyboard top mounting plate 66. Mounting plate 66 would include other conventional openings and housings for supporting other conventional keys for depression, and thereby comprise a complete electronic keyboard 59. Actuator 64 and mounting plate 66 function as a support means which supports external body 62 for limited angular tilting movement relative to mounting plate 66 freely about 360°, as will become more apparent from the continuing discussion.

A rubber dome sheet 68 is received immediately beneath mounting plate 66, and is provided with a series of domes for biasing the external key bodies 62 to a resting, extended position. A dome 70 is so depicted for engaging with external key body 62 at a key body stem 90. Beneath dome sheet 68 is a multi-layer switching membrane 72. A rigid backing plate 74 is immediately adjacent and beneath switching membrane 72. Key external body 62 is depressible through dome sheet 68 and switching membrane 72 against backing plate 74.

Switching membrane 72 would be analogous in function to the switching membrane of the above-described prior art embodiment in that a conventional central switch is provided as well as a force-sensitive resistor having opposed conductors with an overall junction resistance which varies inversely with pressure applied thereto. The force-sensitive resistor and conventional switch of switching membrane 72 are positioned relative to backing plate 74 and external body 62 for bearing engagement against backing plate 74 upon depression of external body 62. However, the force-sensitive resistor in accordance with certain aspects of the invention is different than that of the above-described prior art. And, in certain aspects of the invention, the opposed conductors of the force-sensitive resistor are not subjected to a resting preloaded compression against one another as in the prior art.

Figure 8:
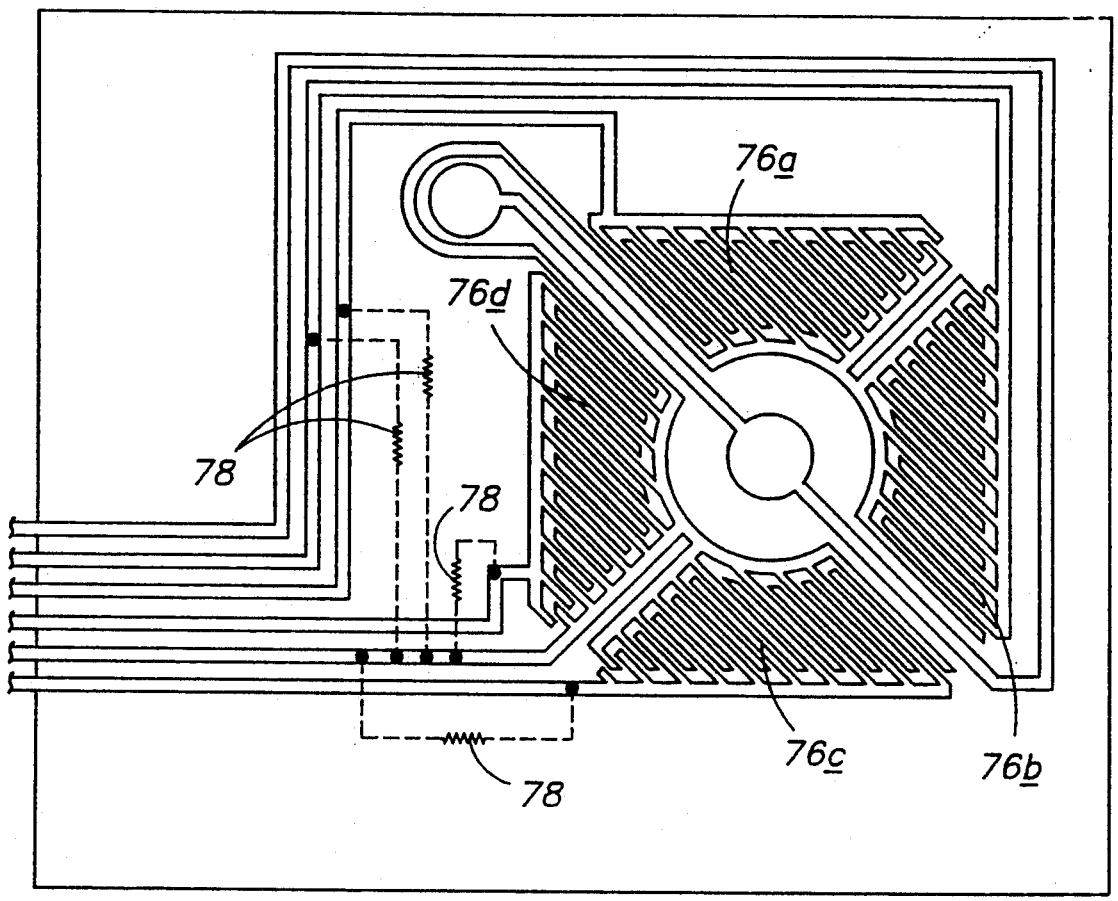
FIG. 8 is an enlarged diagrammatic depiction of the underside of a top layer of a switching membrane component of the FIGS. 6 and 7 cursor movement control key and electronic keyboard.

FIG. 8 illustrates the electrode regions of a force-sensitive resistor of switching membrane 72 in accordance with aspects of the invention. Switching membrane 72 would be constructed in a similar three laminate composite as switching membrane 22 of the FIGS. 1–4 prior art embodiment. Specifically, the conductive interdigiting electrodes would preferably be applied on the underside of the top laminate, and the pressure-sensitive conductive polymer would preferably be continuously formed on the upper side of the spacer layer in registration with the interdigiting electrodes. The preferred embodiment of the interdigiting electrode portion has a plurality or an array of four isolated conductive electrode regions 76a, 76b, 76c and 76d equally spaced about 360°. Region 76a is centrally and symmetrically formed about the 0°, alternately 360°, position. Region 76b is centrally and symmetrically formed about the 90° position. Region 76c is centrally and symmetrically formed about the 180° position. Finally, region 76d is centrally and symmetrically formed about the 270° position. Actuator 64 (FIGS. 6 and 7) is constructed, positioned and mounted for engagement with each of region 76a–76d, as will be more fully described below. Such positioning of the interdigiting electrode regions has significant improvements over the diagonal 45°, 135°, 225° and 325° positioning of the above-described prior art key. The prior art electrode positioning produces less than desirable operation for cursor movements in the 0°, 90°, 180°, and 270° positions due to information derived from a pair of regions for cursor movements in one of these four polar directions. Principal operator movements of a cursor are typically in one of the four polar directions. The above positioning, in conjunction with covering a greater operative area with interdigiting electrodes, produces more reliable operation than that obtained with the prior art key.

In the preferred embodiment, the above-described array of conductive electrode regions is utilized with a force-sensitive conductive material which eliminates the need for preloading the force-sensitive resistor. Such a material will be predictably and consistently responsive to operator proportional force inputs between about 50 and 175 grams. The force/resistance characteristics of such a material are illustrated graphically in FIG. 15 in comparison with the force-sensitive material of the above-described prior art cursor movement control key. As illustrated, with the improved material, the force/resistance properties become substantially linear and less steep above about a 50 gram input. Whereas with the prior art, overall force inputs in excess of 200 grams are required. A construction in accordance with the invention eliminates the need for preloading, yet enables reliable operation with operator force inputs less than 100 grams, for example.

Figure 15:
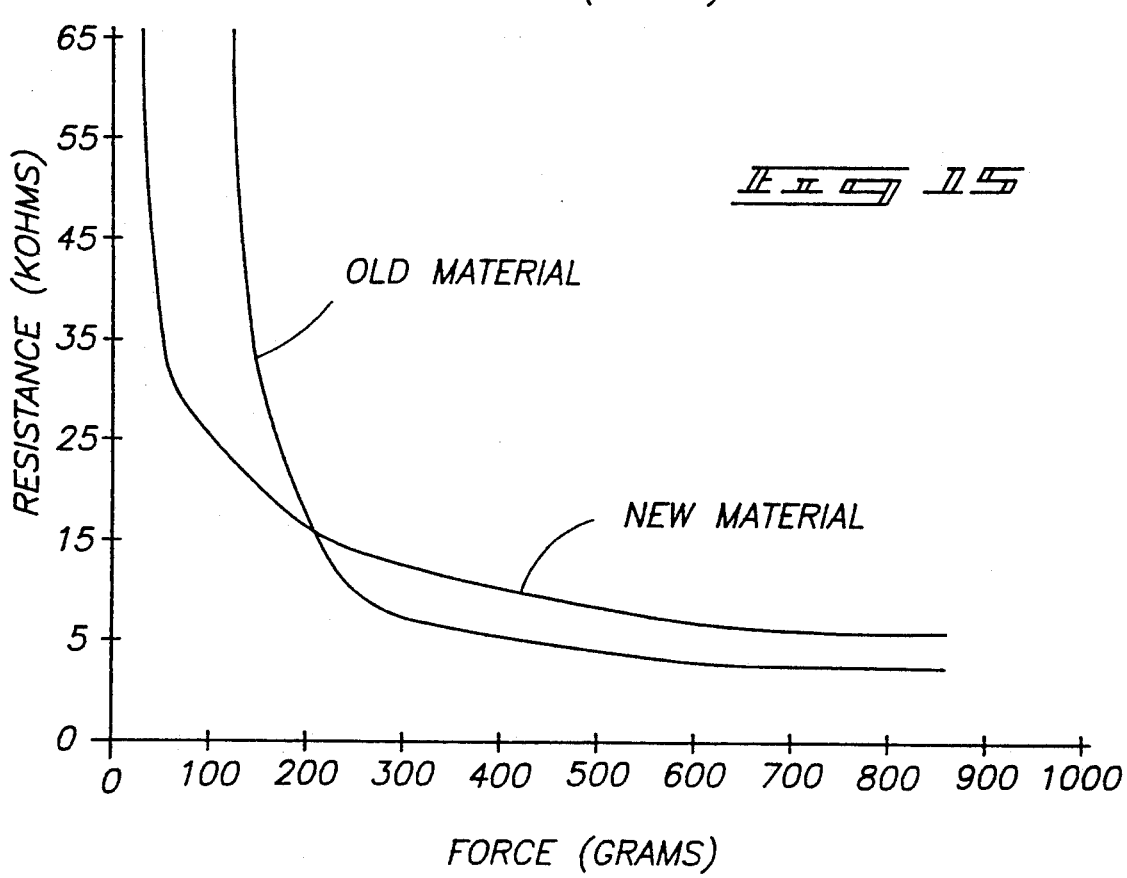
FIG. 15 is a graph of force versus resistance for a force-sensitive resistor material incorporated in the cursor movement control key and electronic keyboard of FIGS. 6 and 7, and compares such curve to the force-sensitive resistor material incorporated with the prior art FIG. 1 cursor movement control key.

Most preferably, each of conductive electrode regions 76a, 76b, 76c and 76d is connected with a parallel resistance 78 (FIG. 8) in an associated circuit board, which causes the resistance response shown in FIG. 15 to be more linear for operator force inputs below some preset value selected somewhere between about 50 and 175 grams. This will avoid unpredictable or erratic cursor movement which would be annoying to the user based upon very light force inputs.

Reference is now made to FIGS. 6, 7 and 10–14 for greater description of actuator 64. Actuator 64 is positioned between external cap body 62 and backing plate 74. Actuator 64 supports external body 62 for free angular tilting movement about 360° relative to mounting plate 66, and is engageable against the opposed conductors of the force-sensitive resistor of switching membrane 72 upon depression and angular tilting of external body 62. At least one of actuator 64 and external body 62 includes opposed lateral projections which engage relative to the other of the actuator and mounting plate to both a) retain the actuator to the mounting plate, and yet b) allow clearance for tilting movement of the actuator relative to the mounting plate.

More particularly, actuator 64 includes opposed faces 80, 82 and peripheral edges 84a, 84b, 84c, and 84d. Face 80 of actuator 64 is centrally provided with a raised ring or cylinder 86 and opposing key retaining clip-slots 88. Central transverse stem 90 of key cap 62 is slidably and depressible received within raised ring 86. Conventional spring-loaded clips 93 on key cap 62 engage within each of clip openings 88 to prevent key cap 62 from being slid completely upwardly and away from actuator 64 in normal operation. In this manner, key cap 62 is retained relative to the keyboard by engagement with actuator 64.

Peripheral edges 84a-84d are comprised of raised rim portions 92 which extend upwardly from face 80. A pair of opposed lateral projections 94 project from the upper edge of rim 92 from peripheral edges 84b and 84d. This should provide an overall width of actuator 64 at its upper edge which is slightly greater than the diameter of the opening 61 in mounting plate 66 within which actuator 64 is received.

Actuator face 82 is provided with a plurality of four arcuate engagement pads 96a, 96b, 96c, and 96d which are centrally positioned for selective engagement with isolated conductive electrode regions 76a, 76b, 76c, and 76d. Accordingly, pads 96a, 96b, 96c and 96d are equally spaced about 360° and symmetrically positioned at one each of the 0°, 90°, 180°, and 270° positions for engagement of electrode regions 76a, 76b, 76c, and 76d upon depression and selective angular tilting of external body 62. The faces of the actuator pads are rounded about a 3.00 inch radius. Actuator 64 is slightly rectangular in shape, with the outer portions of opposed engagement pads 96a and 96c projecting outwardly beyond the actuator edges 84a and 84c to define another pair of opposed lateral projections. Accordingly in the preferred embodiment, actuator 64 has two pairs of opposed lateral projections in projection pair 96a, 96c and projection pair 94. Such pairs are rotationally offset from one another by 90°, with each engaging one of the opposed faces of mounting plate 66.

Figure 6:
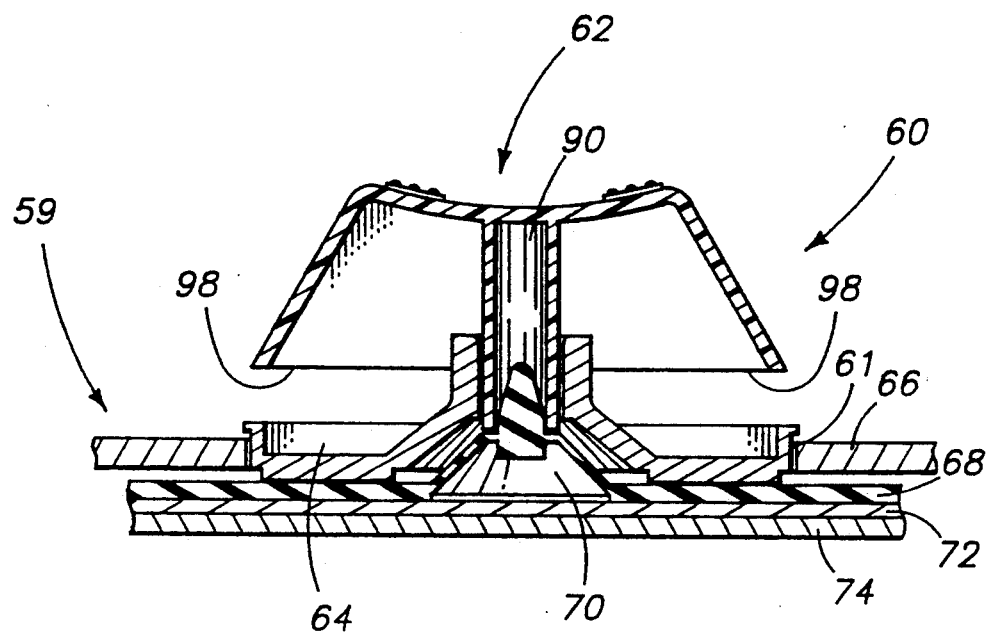
FIG. 6 is a diagrammatic fragmentary/section view of a cursor movement control key and electronic keyboard in accordance with the invention. It is taken at a location that would correspond to line 6—6 in FIG. 10.
Figure 6A:
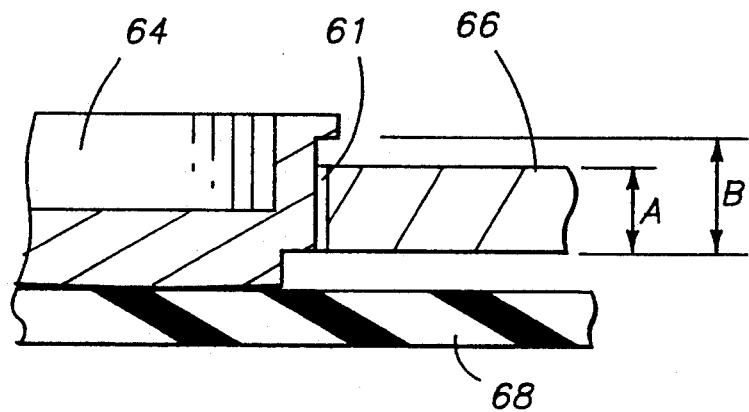
FIG. 6A is an enlarged portion of FIG. 6 illustrating clearance engagement between two components of the FIG. 6 construction.
Figure 7:
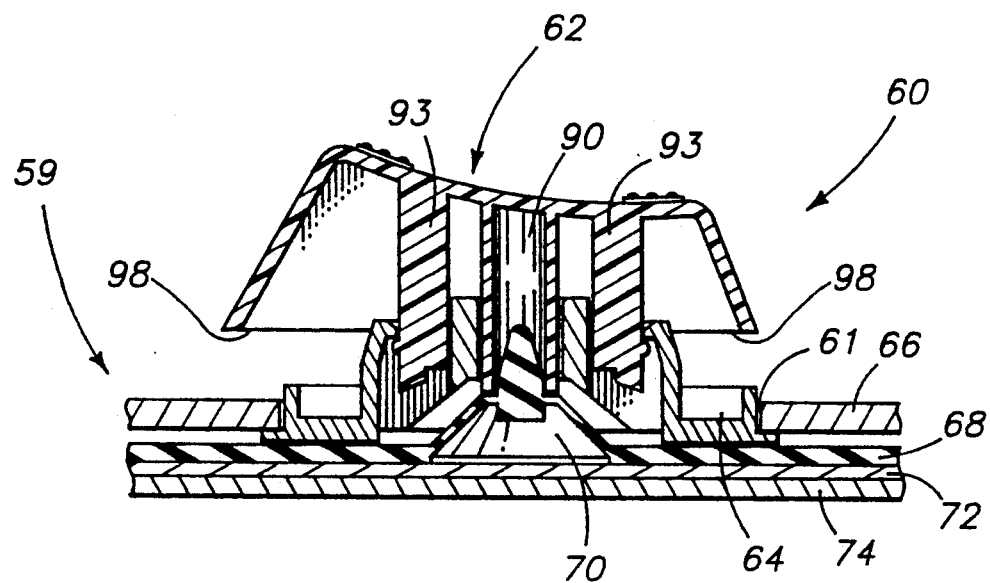
FIG. 7 is a diagrammatic fragmentary/section view of the cursor movement control key and electronic keyboard of FIG. 6. It is a 90° rotated view from that shown in FIG. 6, and is taken at a location that would correspond to line 7—7 in FIG. 10.
Figure 7A:
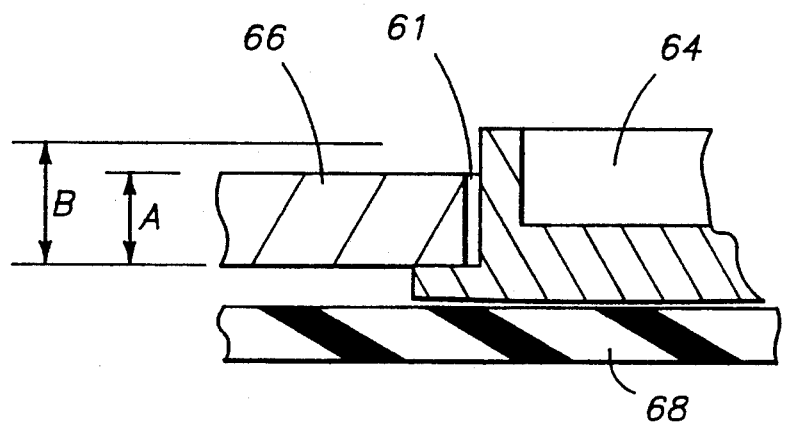
FIG. 7A is an enlarged portion of FIG. 7 illustrating clearance engagement between the same two components of FIG. 6A.

Referring to FIGS. 6a and 7a, actuator 64 is constructed of a size relative to the thickness of mounting plate 66 to provide sufficient free-play clearance between the actuator and mounting plate to enable limited movement and tilting of actuator 64 relative to mounting plate 66. Mounting plate 66 is illustrated as having some defined thickness "A" immediately adjacent mounting plate opening 61. The interior distance "B" between the opposed lateral projections 96a, 96b and those of 94, should be at least 0.015 inch greater than that of dimension "A" to allow limited displacement and angling of actuator 64 relative to plate 66. Actuator 64 would be made of a conventional plastic material, and can be snap fit into mounting plate 66. Actuator 64 would be retained relative thereto via projections 94 and 96a, 96c to facilitate assembly of the keyboard, yet provided with sufficient clearance for free-play movement relative to mounting plate 66 to provide sufficient space for actuation of the force-sensitive resistor. Prior art keyboards include housings for depressibly supporting a key which snap fit tightly into the keyboard openings, and specifically do not provide limited movement of the housing relative to the mounting plate.

Portions of actuator 64 and external cap 62 are engageable relative to one another to cause external cap 62 to bear against the actuator upon depression. This will enable relative tilting movement of actuator 64 for bearing engagement relative to the force-sensitive resistor of switching membrane 72 and backing plate 74 upon depression of external body 62. More particularly, external key body 62 has defined outer edges 98. These are sized, positioned and constructed such that they engage against the raised rim 92 at the peripheral edges 84a-84d of actuator 64 (FIG. 14). In this manner, external body 62 engages actuator 64 at locations on actuator 64 which are at or closer to the peripheral actuator edges than to the actuator center. This provides a distinct advantage not shown or suggested by the prior art. For example, the above-described prior art cursor movement control key provides engagement of the key cap with the actuator centrally on the actuator, as opposed to at its edges. Edge engagement versus central engagement better transfers the applied force directly relative to the actuator pads, providing for more reliable force transfer and operation.

FIGS. 6 and 14 illustrate a key in accordance with the invention in both an extended and depressed and angled position. Comparative loading of the isolated regions of the force-sensitive resistor are used to impart movement to the cursor. For example, any of a perfectly 0°, 90°, 180°, or 270° displacement will largely load one of the respective electrode regions causing cursor movement in that direction. Any other angular tilting of force application upon the external key will load two adjacent regions of the force-sensitive resistor in a varying manner, which will be interpreted to move the cursor in the direction of force application.

Figure 16:
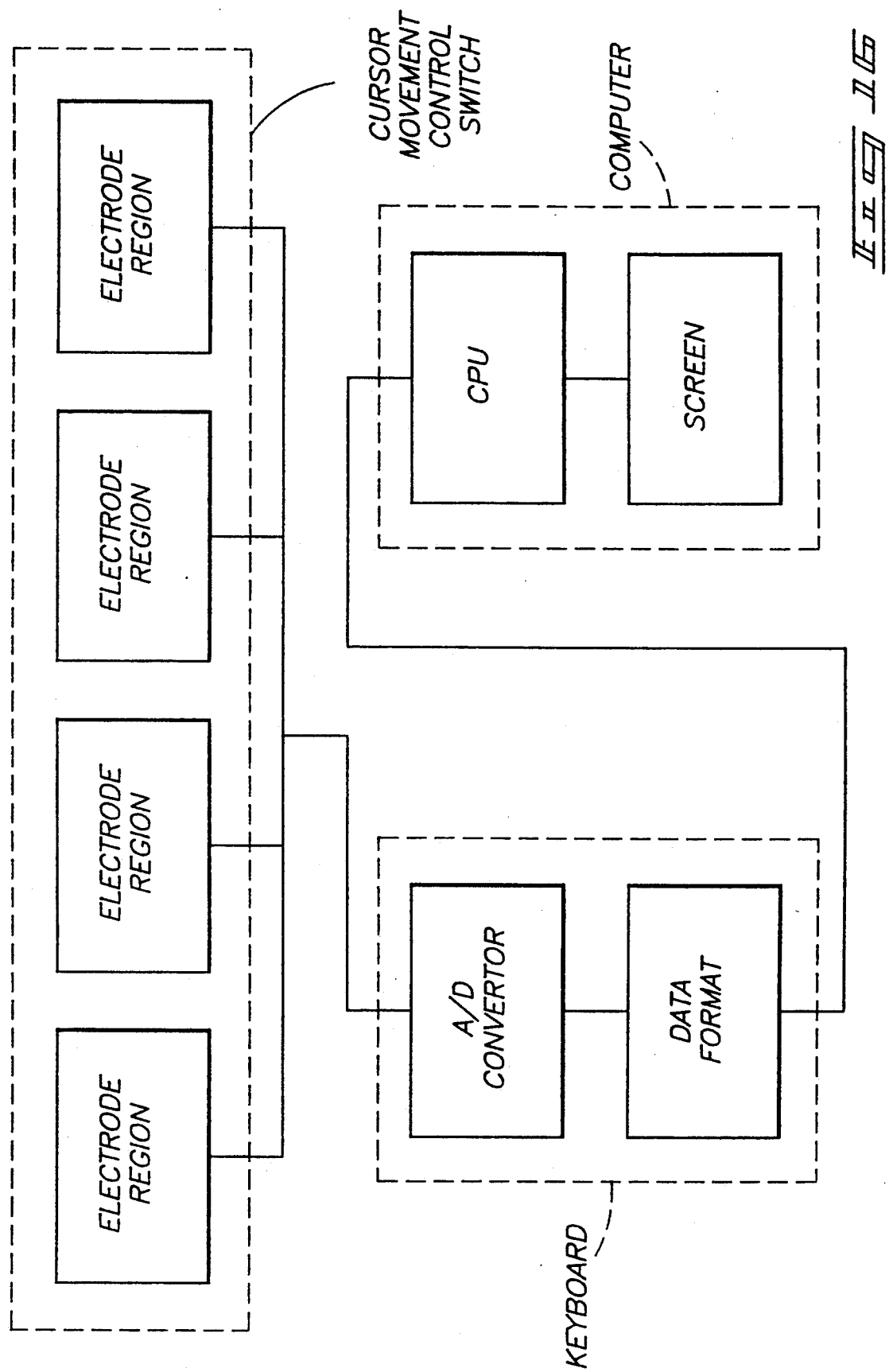
FIG. 16 is a block diagram illustrating translation of force-sensitive resistor readings into cursor movement on the computer screen.

The above described cursor movement control would typically be incorporated as one of a plurality of keys on a electronic computer keyboard having integrated circuitry in electrical communication with the force-sensitive resistor for interpreting depression and tilting of the external body to selectively effect cursor movement. FIG. 16 is a block diagram illustrating the logic interconnection of various components. As illustrated, analog signals from the interdigiting electrode regions at the keyboard level are converted to digital signals, and formatted for transmission to the computer CPU. There, the inputs are interpreted and cause movement of the cursor on the screen.

Figure 9:
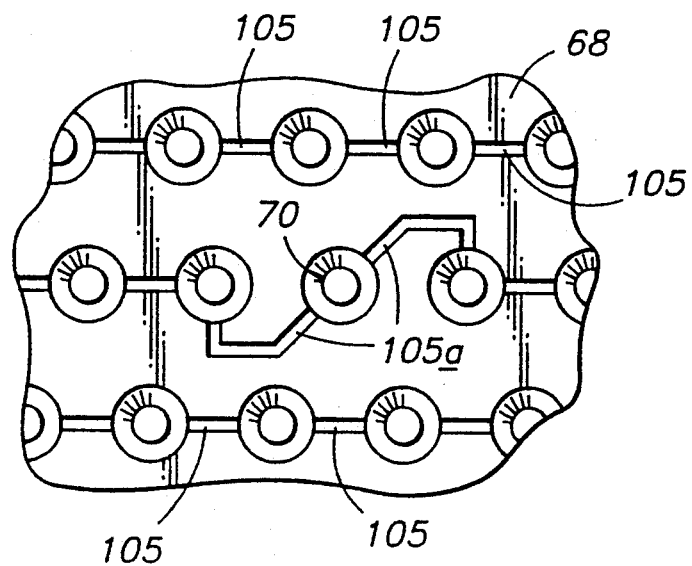
FIG. 9 is a bottom view of a rubber dome sheet portion of the cursor movement control key and electronic keyboard of FIGS. 6 and 7.
Figure 10:
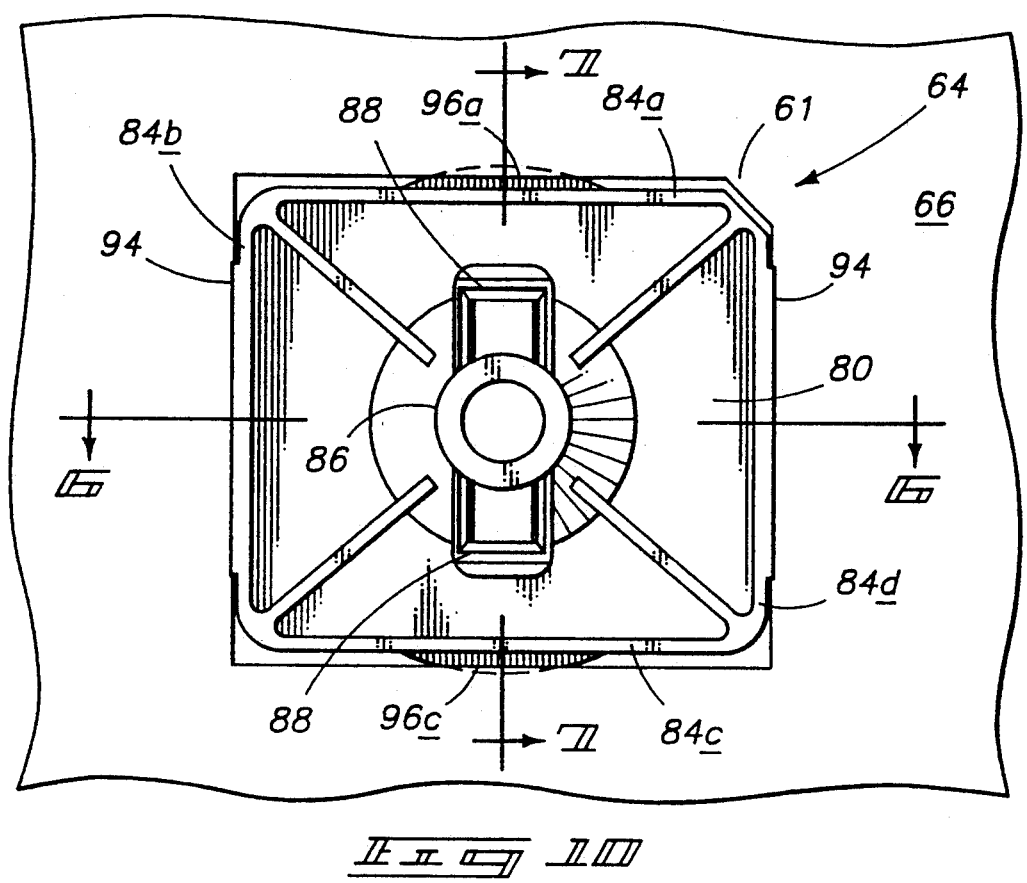
FIG. 10 is a top view of an actuator component and mounting plate of the cursor movement control key and electronic keyboard of FIGS. 6 and 7.
Figure 11:
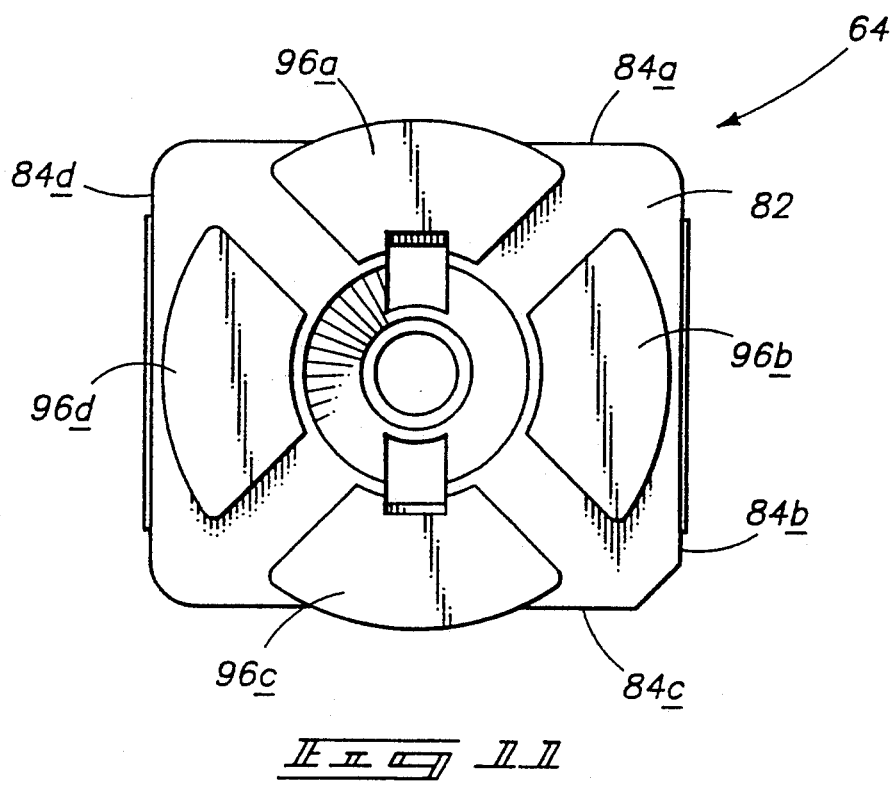
FIG. 11 is a bottom view of the actuator component of FIG. 10.
Figure 12:
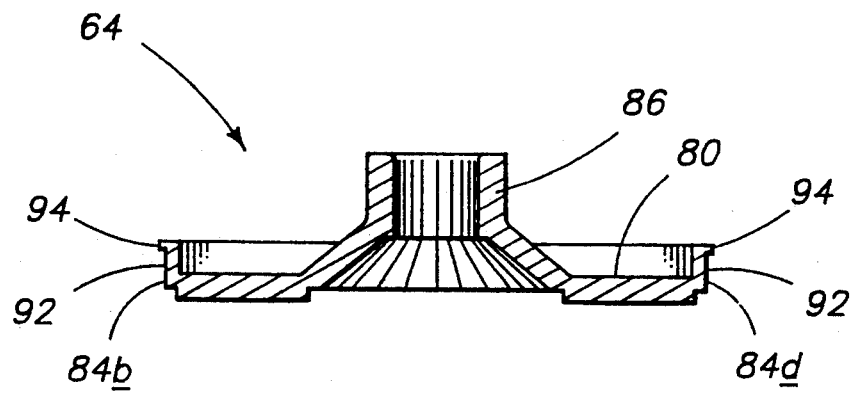
FIG. 12 is a cross section view of an actuator component taken through line 6—6 in FIG. 10.
Figure 13:
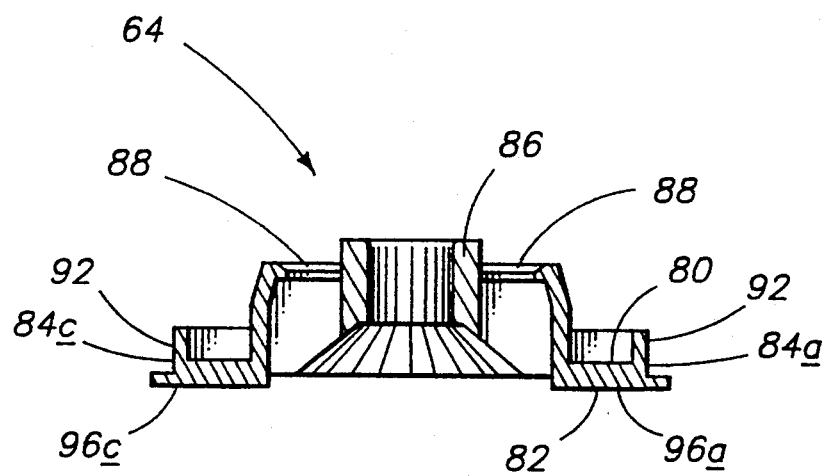
FIG. 13 is a cross section view of the actuator component of FIG. 10 taken through line 7—7 in FIG. 10.

FIG. 9 illustrates a bottom view of rubber dome sheet 98 illustrating a plurality of depressible domes, including dome 70. The various domes are interconnected with recessed channels 105 to provide space for air to flow the result of a dome being depressed. It is most preferable that, in connection with key 60, such channels not be positioned directly over an interdigiting electrode region. Such a positioning could result in less than all of the applied force being impinged upon the force-sensitive resistor. Accordingly, it is preferable that the channel associated with dome 70 approach from between the interdigiting electrode regions 76a, 76b, 76c, and 76d along 45° diagonals, as indicated by channels 105a in FIG. 9.

In compliance with the statute, the invention has been described in language more or less specific as to structural and methodical features. It is to be understood, however, that the invention is not limited to the specific features shown and described, since the means and construction herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A cursor movement control key for a computer having a video display, the key comprising:
   an external body sized for engagement by an operator's finger;
   support means supporting the external body for angular tilting movement about 360°;
   a force-sensitive resistor comprised of opposed conductors having a junction resistance which varies inversely with pressure applied thereto, the force-sensitive resistor being centered on an origin of perpendicular first and second axes, the first axis running north and south, and the second axis running east and west, the force-sensitive resistor comprising an array of four isolated conductive electrode regions equally spaced about 360°, each of the conductive electrode regions being centrally and symmetrically formed about one of 0°, 90°, 180°, and 270° positions, wherein the 0° position coincides with the first axis at a location north of the origin, the 90° position coincides with the second axis at a location east of the origin, the 180° position coincides with the first axis at a location south of the origin, and the 270° position coincides with the second axis at a location west of the origin; and
   an actuator operably engageable against the opposed conductors upon depression and angular tilting of the external body, the actuator having at least four engagement pads, the four engagement pads being equally spaced about 360° and symmetrically positioned to selectively engage one each of the 0°, 90°, 180°, and 270° conductive electrode regions upon depression and selective angular tilting of the external body, the actuator including peripheral edges and a center, the external body engaging the actuator, for depression against the force-sensitive resistor, at an actuator location which is at or closer to an actuator peripheral edge than to the actuator center.

2. A cursor movement control key for a computer having a video display, the key comprising:
   an external body sized for engagement by an operator's finger;
   support means supporting the external body for angular tilting movement about 360°;
   a force-sensitive resistor comprised of opposed conductors having a junction resistance which varies inversely with pressure applied thereto, the force-sensitive resistor being centered on an origin of perpendicular first and second axes, the first axis running north and south, and the second axis running east and west, the force-sensitive resistor comprising an array of four isolated conductive electrode regions equally spaced about 360°, each of the conductive electrode regions being centrally and symmetrically formed about one of 0°, 90°, 180°, and 270° positions, wherein the 0° position coincides with the first axis at a location north of the origin, the 90° position coincides with the second axis at a location east of the origin, the 180° position coincides with the first axis at a location south of the origin, and the 270° position coincides with the second axis at a location west of the origin; and
   an actuator operably engageable against the opposed conductors upon depression and angular tilting of the external body, the actuator having at least four engagement pads, the four engagement pads being equally spaced about 360° and symmetrically positioned to selectively engage one each of the 0°, 90°, 180°, and 270° conductive electrode regions upon depression and selective angular tilting of the external body, the actuator including opposed lateral projections for engagement with opposing faces of a keyboard mounting plate to both, a) retain the actuator to the mounting plate, and yet b) allow clearance for tilting movement of the actuator relative to the mounting plate.

3. The cursor movement control key of claim 1 wherein, each of the engagement pads is arcuate in shape and centrally provided about one of the 0°, 90°, 180° and 270° positions.

4. The cursor movement control key of claim 1 wherein,
   each of the engagement pads is arcuate in shape and centrally provided about one of the 0°, 90°, 180° and 270° positions; and
   the actuator includes opposed lateral projections for engagement with opposing faces of a keyboard mounting plate to both, a) retain the actuator to the mounting plate, and yet b) allow clearance for tilting movement of the actuator relative to the mounting plate.

5. An electronic computer keyboard for a computer having a video display, the keyboard comprising:
   a plurality of keys;
   a mounting plate operably supporting the keys for depression, the mounting plate having opposing faces, a defined thickness and a plurality of openings extending therethrough between the opposing faces, the openings depressibly receiving the keys;
   a backing plate against which the keys are operably depressible;
   biasing means for biasing the keys to an extended position;
   at least one of the plurality of keys comprising a cursor movement control key, the cursor movement control key comprising:
   an external body sized for engagement by an operator's finger and having a transverse stem;
   a force-sensitive resistor comprised of opposed conductors having a junction resistance which varies inversely with pressure applied thereto, the opposed conductors collectively comprising a plurality of isolated conductive electrode regions, the force-sensitive resistor being positioned relative to the backing plate for bearing engagement against the backing plate upon depression of the external body;
   an actuator positioned between the external body and backing plate, the actuator supporting the external body for limited depression relative thereto and supporting the external body for selective tilting movement about 360° relative to the mounting plate, the actuator including opposing faces and peripheral edges and having a shape and size complementary for receipt in one of the mounting plate openings, the actuator being so received in one of the mounting plate openings;
   at least one of the actuator and mounting plate including opposed lateral projections which engage relative to the other of the actuator and mounting plate to both, a) retain the actuator to the mounting plate, and yet b) allow clearance for tilting movement of the actuator relative to the mounting plate;

portions of the actuator and external body being engageable relative to one another to cause the external body to bear against the actuator for tilting movement thereof and bearing engagement relative to the force-sensitive resistor and backing plate upon depression of the external body by an operator;

one of the actuator opposed faces having a plurality of engagement pads positioned to selectively engage the plurality of isolated conductive electrode regions upon selective engagement of the external body and actuator; and the electronic keyboard including integrated circuitry in electrical communication with the force-sensitive resistor for interpreting depression and tilting of the external body to selectively effect cursor movement.

6. The electronic computer keyboard of claim 5 wherein the lateral projections are positioned to provide a free-play clearance between the actuator and mounting plate of at least 0.015 inch.

7. The electronic computer keyboard of claim 5 wherein,
the actuator includes an opening through which the external body stem is slidably received;
the portions of the actuator and external body engageable relative to one another limiting sliding movement of the external stem relative to the actuator opening; and
the actuator includes a center, the portion of the external body engaging the actuator portion, for depression of the actuator against the force-sensitive resistor, at an actuator location which is at or closer to an actuator peripheral edge than to the actuator center.

8. The electronic computer keyboard of claim 7 wherein the lateral projections are positioned to provide a free-play clearance between the actuator and mounting plate of at least 0.015 inch.

9. The electronic computer keyboard of claim 5 wherein the opposed lateral projections extend from the actuator.

10. The electronic computer keyboard of claim 5 wherein,
the mounting plate has a defined thickness immediately adjacent the mounting plate opening within which the actuator is received; and
the actuator comprises at least two pairs of opposed lateral projections, the two pairs being rotationally offset from one another by about 90°, one pair of opposed lateral projections engaging one of the opposed faces of the mounting plate, the other pair of opposed lateral projections engaging the other of the opposed faces of the mounting plate, the two pairs being transversely offset from one another by a distance at least as great as the defined mounting plate thickness plus 0.015 inch.

11. The electronic computer keyboard of claim 5 wherein opposed lateral projections extend from the actuator, a pair of laterally opposing engagement pads on the actuator extending beyond the actuator peripheral edges to define such opposed lateral projections.

12. The electronic computer keyboard of claim 5 wherein,
the actuator includes a center; and
the portion of the external body engaging the actuator portion, for depression of the actuator against the force-sensitive resistor, doing so at an actuator location which is at or closer to an actuator peripheral edge than to the actuator center.

13. The electronic computer keyboard of claim 5 wherein each of the engagement pads is arcuate in shape.

14. The electronic computer keyboard of claim 5 wherein opposed lateral projections extend from the actuator, each of the engagement pads is arcuate in shape, a pair of laterally opposing arcuate engagement pads on the actuator extending beyond the actuator peripheral edges to define such opposed lateral projections.

15. An electronic computer keyboard for a computer having a video display, the keyboard comprising:
a plurality of keys;
a mounting plate operably supporting the keys for depression, the mounting plate having opposing faces, a defined thickness and a plurality of openings extending therethrough between the opposing faces, the openings depressibly receiving the keys;
a backing plate against which the keys are operably depressible;
biasing means for biasing the keys to an extended position;
at least one of the plurality of keys comprising a cursor movement control key, the cursor movement control key comprising:
an external body sized for engagement by an operator's finger and having a transverse stem;
a force-sensitive resistor comprised of opposed conductors having a junction resistance which varies inversely with pressure applied thereto, the force-sensitive resistor being centered on an orgin of perpendicular first and second axes, the first axis running north and south, and the second axis running east and west, the opposed conductors collectively comprising four isolated conductive electrode regions equally spaced about 360°, each of the conductive electrode regions being centrally and symmetrically formed about one of 0°, 90°, 180°, and 270° positions, wherein the 0° position coincides with the first axis at a location north of the origin, the 90° position coincides with the second axis at a location east of the origin, the 180° position coincides with the first axis at a location south of the origin, and the 270° position coincides with the second axis at a location west of the origin, the force-sensitive resistor being positioned relative to the backing plate for bearing engagement against the backing plate upon depression of the external body
an actuator positioned between the external body and backing plate, the actuator supporting the external body for limited depression relative thereto and supporting the external body for angular tilting movement about 360° relative to the mounting plate, the actuator including opposing faces and peripheral edges and having a shape and size complementary for receipt in one of the mounting plate openings, the actuator being so received in one of the mounting plate openings;
at least one of the actuator and mounting plate including opposed lateral projections which engage relative to the other of the actuator and mounting plate to both, a) retain the actuator to the mounting plate, and yet b) allow clearance for tilting movement of the actuator relative to the mounting plate;

portions of the actuator and external and external body being engageable relative to one another to cause the external body to bear against the actuator for tilting movement thereof and bearing engagement relative to the force-sensitive resistor and backing plate upon depression of the external body by an operator;

one of the actuator opposed faces having at least four engagement pads, the four engagement pads being equally spaced about 360° and symmetrically positioned to selectively engage one each of the 0°, 90°, 180°, and 270° conductive electrode regions upon selective engagement of the external body and actuator; and the electronic keyboard including integrated circuitry in electrical communication with the force-sensitive resistor for interpreting depression and tilting of the external body to selectively effect cursor movement.

16. The electronic computer keyboard of claim 15 wherein, the actuator includes an opening through which the external body stem is slidably received;

the portions of the actuator and external body engageable relative to one another limiting sliding movement of the external stem relative to the actuator opening; and the actuator includes a center, the portion of the external body engaging the actuator portion, for depression of the actuator against the force-sensitive resistor, at an actuator location which is at or closer to an actuator peripheral edge than to the actuator center.

17. The electronic computer keyboard of claim 15 wherein the opposed lateral projections extend from the actuator.

18. The electronic computer keyboard of claim 15 wherein, the mounting plate has a defined thickness immediately adjacent the mounting plate opening within which the actuator is received; and the actuator comprises at least two pairs of opposed lateral projections, the two pairs being rotationally offset from one another by about 90°, one pair of opposed lateral projections engaging one of the opposed faces of the mounting plate, the other pair of opposed lateral projections engaging the other of the opposed faces of the mounting plate, the two pairs being transversely offset from one another by a distance at least as great as the defined mounting plate thickness plus 0.015 inch.

19. The electronic computer keyboard of claim 15 wherein opposed lateral projections extend from the actuator, a pair of laterally opposing engagement pads on the actuator extending beyond the actuator peripheral edges to define such opposed lateral projections.

20. The electronic computer keyboard of claim 15 wherein, the actuator includes a center; and the portion of the external body engaging the actuator portion, for depression of the actuator against the force-sensitive resistor, doing so at an actuator location which is at or closer to an actuator peripheral edge than to the actuator center.

21. A cursor movement control key for a computer having a video display, the key being mountable in a support structure having a mounting plate with an aperture formed therein, the key comprising:

an external body sized for engagement by an operator's finger;

support means supporting the external body for angular tilting movement about 360°;

a force-sensitive resistor comprised of opposed conductors having a junction resistance which varies inversely with pressure applied thereto, the force-sensitive resistor being centered on an origin of perpendicular first and second axes, the first axis running north and south, and the second axis running east and west, the force-sensitive resistor comprising an array of four isolated conductive electrode regions equally spaced about 360°, each of the conductive electrode regions being centrally and symmetrically formed about one of the 0°, 90°, 180°, and 270° positions, wherein the 0° position coincides with the first axis at a location north of the origin, the 90° position coincides with the second axis at a location east of the origin, the 180° position coincides with the first axis at a location south of the origin, and the 270° position coincides with the second axis at a location west of the origin; and an actuator operably engageable against the opposed conductors upon depression and angular tilting of the external body, the actuator having peripheral edges and at least four engagement pads, the four engagement pads being equally spaced about 360° and symmetrically positioned to selectively engage one each of the 0°, 90°, 180°, and 270° conductive electrode regions upon depression and selective angular tilting of the external body, a pair of laterally opposing engagement pads on the actuator extending beyond the actuator peripheral edges to define opposed lateral projections for retaining the actuator within an aperture of a mounting plate.

22. The cursor movement control key of claim 21 wherein each of the engagement pads is arcuate in shape and centrally provided about one of the 0°, 90°, 180° and 270° positions.

23. The cursor movement control key of claim 21 wherein the actuator includes a center, the external body engaging the actuator, for depression against the force-sensitive resistor, at an actuator location which is at or closer to an actuator peripheral edge than to the actuator center.

24. The cursor movement control key of claim 21 wherein:

the actuator includes a center;

each of the engagement pads is arcuate in shape and centrally provided about one of the 0°, 90°, 180° and 270° positions; and the external body engages the actuator, for depression against the force-sensitive resistor, at an actuator location which is at or closer to an actuator peripheral edge than to the actuator center.

25. A cursor movement control key for a computer having a video display, the key being mountable in a support structure having a mounting plate with an aperture formed therein, the key comprising:

an external body sized for engagement by an operator's finger;

support means supporting the external body for angular tilting movement about 360°;

a force-sensitive resistor comprised of opposed conductors having a junction resistance which varies inversely with pressure applied thereto, the force-sensitive resistor comprising an array of four isolated conductive electrode regions equally spaced about 360°; and an actuator operably engagable against the opposed conductors upon depression and angular tilting of the external body, the actuator having peripheral edges and at least four engagement pads, the four engagement pads being equally spaced about 360° and symmetrically positioned to selectively engage one each of the conductive electrode regions upon depression and selective angular tilting of the external body, a pair of laterally opposing engagement pads on the actuator extending beyond the actuator peripheral edges to define opposed lateral projections for retaining the actuator within an aperture of a mounting plate.

26. The cursor movement control key of claim 25 wherein each of the engagement pads is arcuate in shape.

27. The cursor movement control key of claim 25 wherein the actuator includes a center, the external body engaging the actuator, for depression against the force-sensitive resistor, at an actuator location which is at or closer to an actuator peripheral edge than to the actuator center.

28. The cursor movement control key of claim 25 wherein:

the actuator includes a center;

each of the engagement pads is arcuate in shape; and the external body engages the actuator, for depression against the force-sensitive resistor, at an actuator location which is at or closer to an actuator peripheral edge than to the actuator center.

* * * * *